(12) United States Patent
Boyle et al.

(10) Patent No.: US 6,771,060 B1
(45) Date of Patent: Aug. 3, 2004

(54) TESTING CIRCUITS ON SUBSTRATES

(75) Inventors: Timothy J. Boyle, Cupertino, CA (US); Wayne E. Richter, San Jose, CA (US); Ladd T. Johnson, Scotts Valley, CA (US); Lawrence A. Tom, Sunnyvale, CA (US)

(73) Assignee: Electroglas, Inc., San Jose, CA (US)

( * ) Notice: Subject to any disclaimer, the term of this patent is extended or adjusted under 35 U.S.C. 154(b) by 225 days.

(21) Appl. No.: 10/035,482

(22) Filed: Oct. 22, 2001

(51) Int. Cl.$^7$ .............................................. G01R 31/26
(52) U.S. Cl. .................................. 324/158.1; 324/754
(58) Field of Search .......................... 324/158.1, 73.1, 324/754–755, 758, 760, 765

(56) References Cited

U.S. PATENT DOCUMENTS

| | | |
|---|---|---|
| 3,710,251 A | 1/1973 | Hagge et al. |
| 3,949,295 A | 4/1976 | Moorshead |
| 4,460,868 A | 7/1984 | Schmitt et al. |
| 5,012,187 A | 4/1991 | Littlebury |
| 5,077,523 A * | 12/1991 | Blanz .......................... 324/760 |
| 5,123,850 A | 6/1992 | Elder et al. |
| 5,410,259 A * | 4/1995 | Fujihara et al. ............. 324/758 |
| 5,621,313 A * | 4/1997 | Tsuta ....................... 324/158.1 |
| 5,644,245 A | 7/1997 | Saitoh et al. |
| 5,667,077 A | 9/1997 | Goins |
| 5,670,888 A | 9/1997 | Cheng |
| 5,701,666 A * | 12/1997 | DeHaven et al. ............. 29/831 |
| 5,742,173 A | 4/1998 | Nakagomi et al. |
| 5,772,387 A | 6/1998 | Nakamura et al. |
| 5,907,246 A * | 5/1999 | Abraham et al. ........... 324/760 |
| 6,021,380 A | 2/2000 | Fredriksen et al. |
| 6,074,158 A | 6/2000 | Yutaka et al. |
| 6,124,725 A | 9/2000 | Sato |
| 6,137,303 A | 10/2000 | Deckert et al. |
| 6,164,894 A | 12/2000 | Cheng |
| 6,268,740 B1 | 7/2001 | Iida |
| 6,509,750 B1 | 1/2003 | Talbot et al. |

FOREIGN PATENT DOCUMENTS

| | | | |
|---|---|---|---|
| EP | 0 837 333 A2 | 4/1998 | |
| EP | 0 940 683 A2 * | 8/1999 | ......... G01R/31/309 |

OTHER PUBLICATIONS

PCT International Search Report for PCT Application No. PCT/US02/32360, mailed Jan. 29, 2003 (7 pages).
PCT International Search Report for PCT Application No. PCT/US02/32358, mailed Aug. 13, 2003 (6 pages).

* cited by examiner

*Primary Examiner*—Kamand Cuneo
*Assistant Examiner*—Paresh Patel
(74) *Attorney, Agent, or Firm*—Blakely, Sokoloff, Taylor & Zafman LLP

(57) ABSTRACT

The invention provides a method of testing a circuit on a substrate. Generally speaking, a substrate is located in a transfer chuck, a surface of a test chuck is moved into contact with a substrate, the substrate is secured to the test chuck, the test chuck is moved relative to the transfer chuck so that the substrate moves off the transfer chuck, terminals on the substrate are moved into contact with contacts to electrically connect the circuit through the terminals and the contacts to an electric tester, signals are relayed through the terminal and the contacts between the electric tester and the circuit, the terminals are disengaged from the contacts, and the substrate is removed from the test chuck.

9 Claims, 8 Drawing Sheets

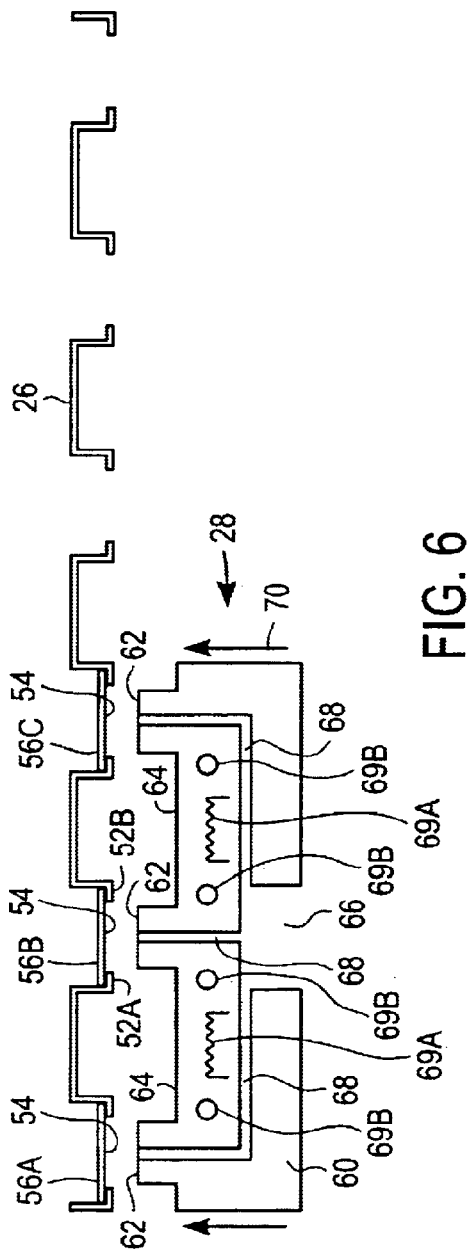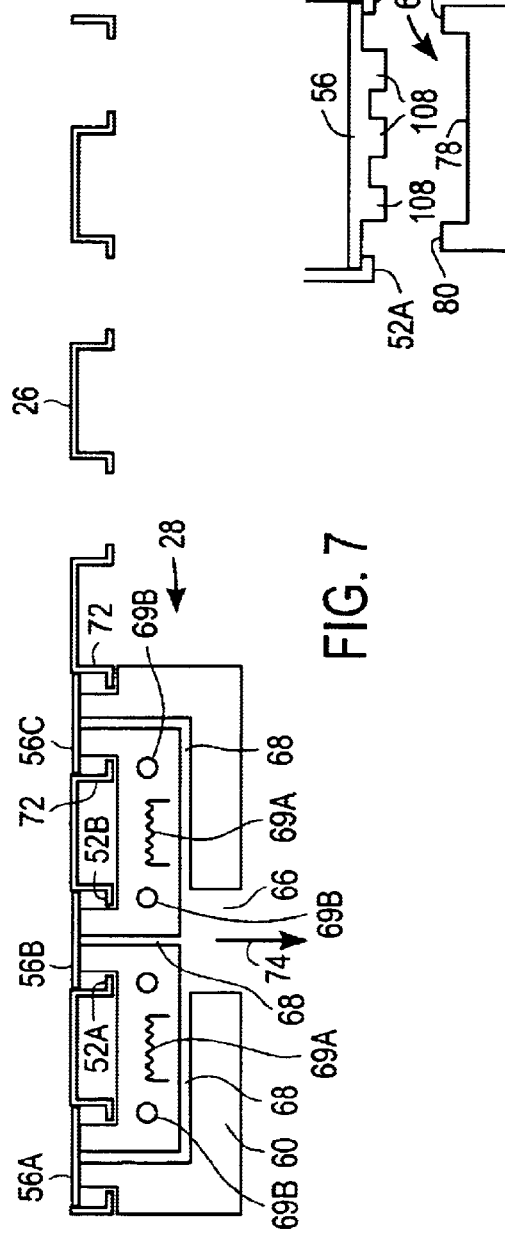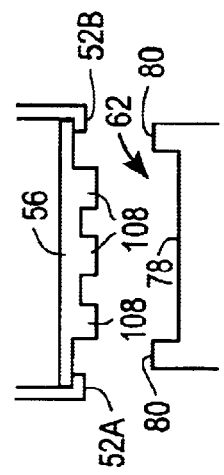

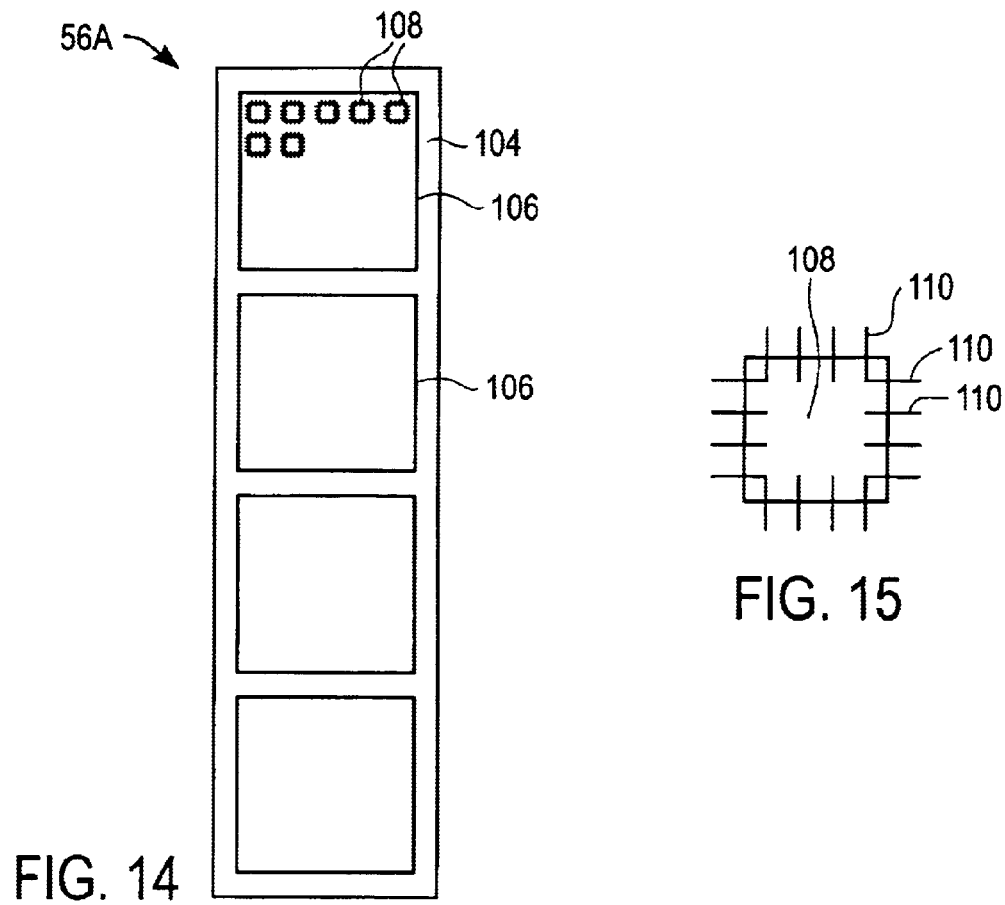
FIG. 14
FIG. 15
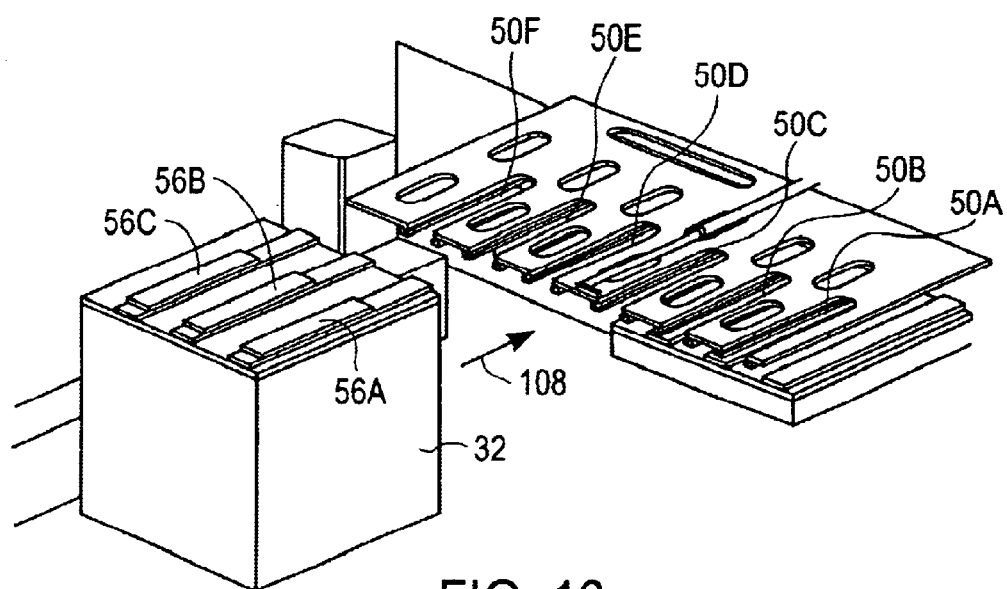
FIG. 16

TESTING CIRCUITS ON SUBSTRATES

BACKGROUND OF THE INVENTION

1). Field of the Invention

This invention relates to a method and apparatus for testing circuits on substrates.

2). Discussion of Related Art

Electronic circuits are often manufactured on semiconductor wafers. A saw is then used to cut the wafer into individual dies, each carrying a respective circuit. The dies are then mounted to other substrates which provide both structural support and electric communication to other devices.

It is often required to test such circuits at various stages during manufacture and before they are sold. An apparatus used for testing such a circuit usually includes a plurality of spring contacts which are brought into contact with terminals connected to the circuit. Electronic signals are then relayed through the contacts and terminals between an electric tester and the circuit so as to test functional integrity of the circuit.

SUMMARY OF THE INVENTION

The invention provides a method of testing a circuit on a substrate. For example, a substrate is located in a transfer chuck, a surface of a test chuck is moved into contact with a substrate, the substrate is secured to the test chuck, the test chuck is moved relative to the transfer chuck so that the substrate moves off the transfer chuck, terminals on the substrate are moved into contact with contacts to electrically connect the circuit through the terminals and the contacts to an electric tester, signals are relayed through the terminals and the contacts between the electric tester and the circuit, the terminals are disengaged from the contacts, and the substrate is removed from the test chuck.

According to one aspect of the invention an image is recorded of a surface of the substrate while still on the transfer chuck, for example while moving off the transfer chuck.

According to another aspect of the invention, an image is recorded of a surface of the substrate in a single pass.

According to a further aspect of the invention, a plurality of substrates are simultaneously held by the test chuck and may be simultaneously scanned and may be simultaneously heated or cooled.

The invention also provides a corresponding apparatus.

BRIEF DESCRIPTION OF THE DRAWINGS

The invention is further described by way of example with reference to the accompanying drawings wherein:

FIG. 6 is an end view of the transfer chuck with the substrates thereon, further illustrating an thermal conditioning chuck;

FIG. 7 is a view similar to FIG. 6 after the thermal conditioning chuck is moved so as to elevate the substrates, and air is provided through the thermal conditioning chuck to heat the substrates;

FIG. 7A is an enlarged view of a portion of FIG. 7;

FIG. 14 is a plan view illustrating an example of a substrate which is tested utilizing the apparatus;

FIG. 15 is an enlarged view of a die and terminals on the substrate;

FIG. 16 is a perspective view illustrating movement of the test chuck to again insert the substrates into the transfer chuck;

DETAILED DESCRIPTION OF THE INVENTION

Figure 1:
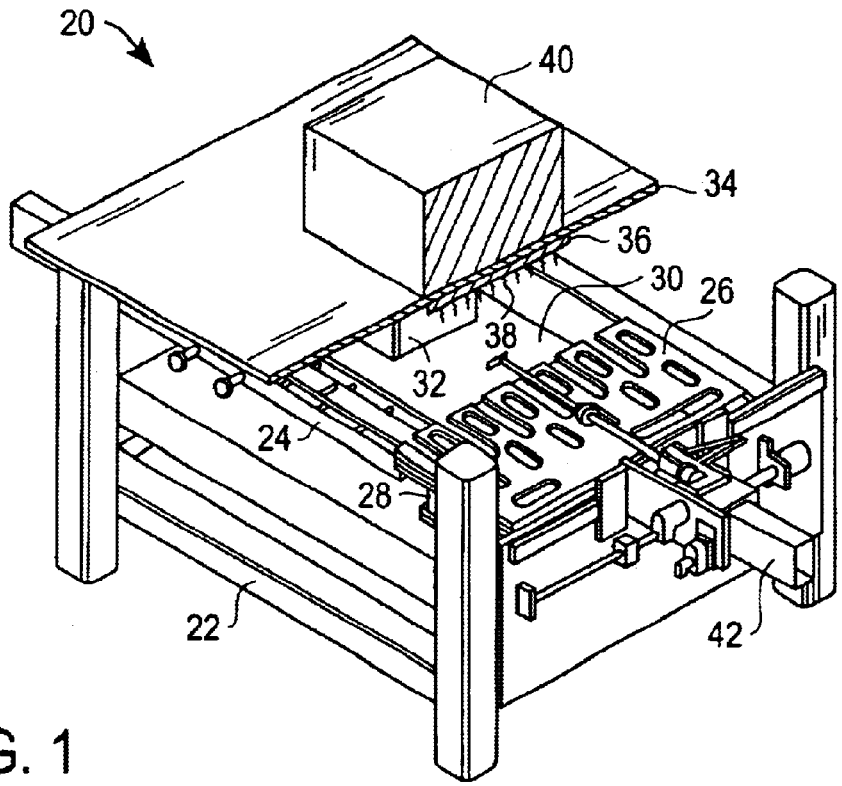
FIG. 1 is a perspective view of an apparatus used for testing circuits on substrates according to an embodiment of the invention.
Figure 2:
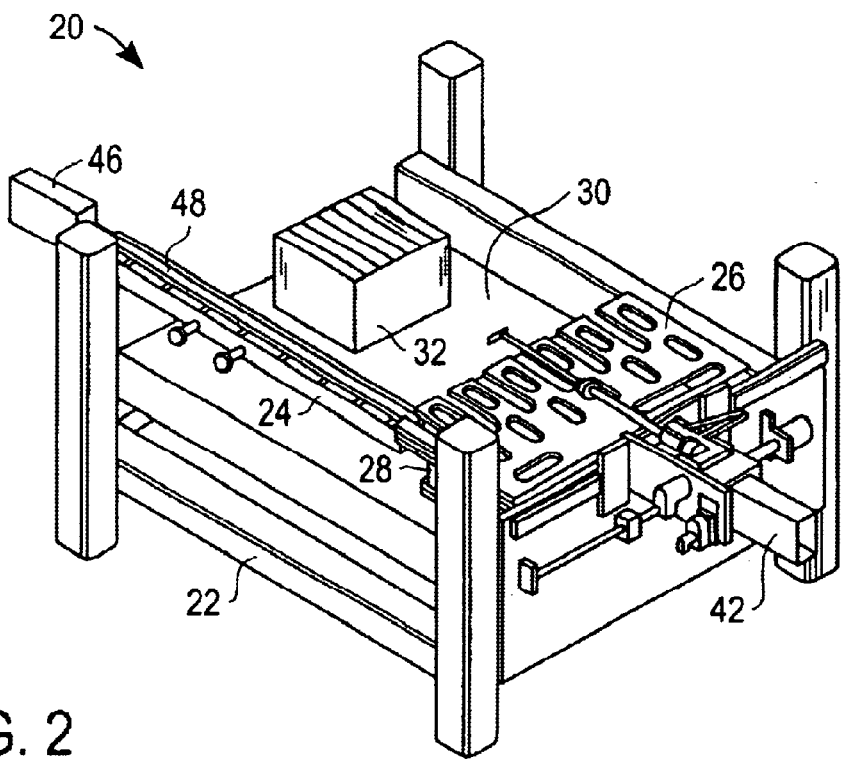
FIG. 2 is a view similar to FIG. 1 where a top plate is removed.

FIGS. 1 and 2 illustrate apparatus 20 used for testing circuits on substrates, according an embodiment of the invention. The apparatus 20 includes a support frame 22, and, either directly or indirectly mounted to the support frame 22, substrate feeding apparatus 24, a transfer chuck 26, thermal conditioning apparatus 28, a platen 30, a test chuck 32, a top plate 34, a probe substrate 36, contacts 38 (shown in exaggerated detail), an electric tester 40, and substrate removal apparatus 42.

The substrate feeding apparatus 24 includes a feed cartridge 46 and a conveyor system 48 located next to the feed cartridge 46. A plurality of substrates are located in the feed cartridge 46. The substrates are then fed one after another onto the conveyor system 48. The conveyor system 48 transfers the substrates from the feed cartridge 46 to the transfer chuck 26.

Figure 3:
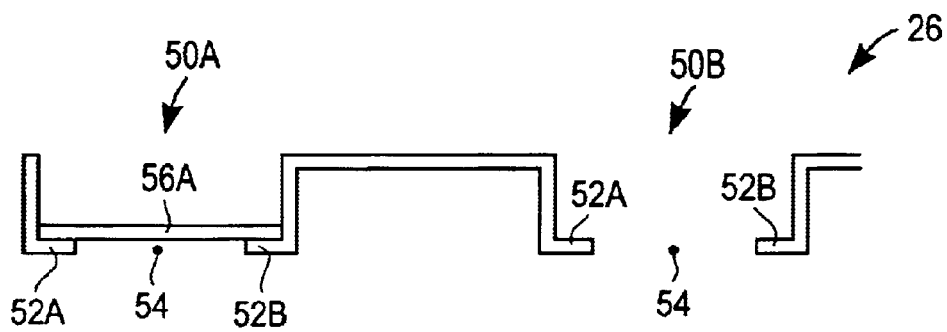
FIG. 3 is an end view of a portion of a transfer chuck of the apparatus.
Figure 4:
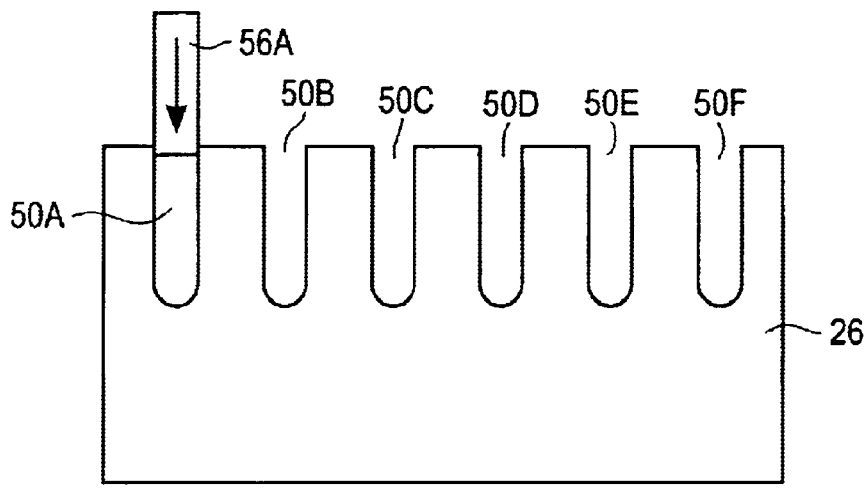
FIG. 4 is a plan view of the transfer chuck illustrating loading of a first substrate.

FIGS. 3 and 4 illustrate the transfer chuck 26 in more detail. The transfer chuck 26 has six slots 50A–F formed therein. Each slot, for example, the slot 50B, has two opposing supports 52A and 52B with a respective gap 54 between the supports 52A and 52B.

A substrate 56A is fed from the conveyor system 48 into the slot 50A. The substrate 56A is dropped onto the supports 52A and 52B of the slot 50A. A lower surface of the substrate 56A is then exposed to the gap 54.

Figure 5:
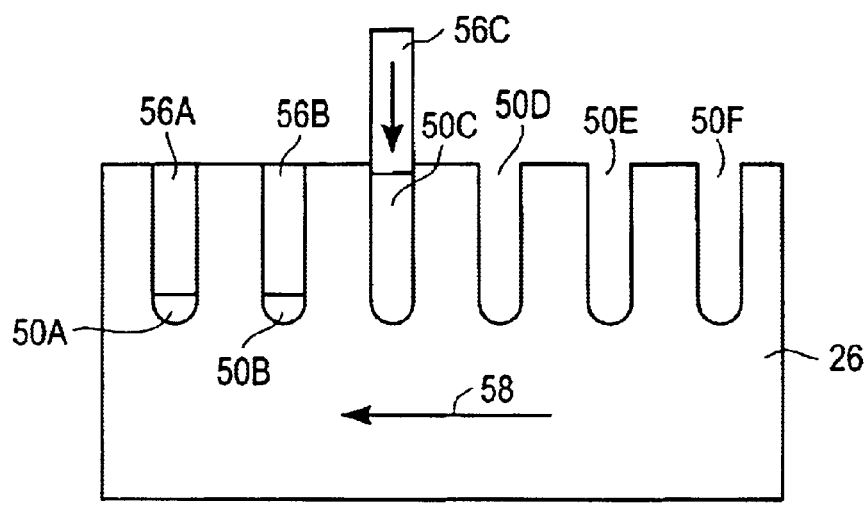
FIG. 5 is a view similar to FIG. 4 after the transfer chuck is moved and more substrates are loaded in the transfer chuck.

As shown on FIG. 5, the transfer chuck 26 is movable in a direction 58 relative to the support frame. The transfer chuck 26 is first moved so that the conveyor system 48 is aligned with the slot 50B. Another substrate 56B is then loaded into the slot 50B. The transfer chuck 26 is then moved so that the slot 50C is aligned with the conveyor system 48. Another substrate 56C is then located in the slot 50C. The conveyor 48 does not fill the slots 50D–F with substrates.

The transfer chuck 26 is then moved back into its position as shown in FIG. 4. As shown in FIG. 6, the substrates 56A–C are thereby located over an thermal conditioning chuck 60 of the thermal conditioning apparatus 28. The thermal conditioning chuck 60 has an upper side having three high surfaces 62 alternated by two low surfaces 64. Each high surface 62 is located below a respective one of the substrates 56A–C. An air outlet opening 66 is formed into a lower surface of the thermal conditioning chuck 60. Air suction openings 68 lead off the air outlet opening 66 and have air entry points in the surfaces 62. Although not shown in FIG. 6, it should be understood that each surface 62 has a plurality of air suction openings 68 spaced from one another into the paper.

The thermal conditioning apparatus also includes resistive elements 69A and cooling passages 69B, which are located within the thermal conditioning chuck 60.

Air is then pumped in a direction 74 out of the air suction opening 66 so that vacuums are created in the air suction openings 68 and on the lower surfaces of the substrates 56A–C. The vacuums secure the substrates 56A–C to the surfaces 62.

The thermal conditioning chuck 60 is movable relative to the support frame 22 in a vertical direction 70. As shown in FIG. 7, such movement of the thermal conditioning chuck 60 moves the surfaces 62 in between the gaps 54 so that each surface 62 contacts a respective lower surface of a respective one of the substrates 56A–C. Further movement of the thermal conditioning chuck 60 in the direction 70 elevates the substrates 56A–C from the supports 52A and 52B. The substrates 56A–C are still laterally supported by sidewalls 72 extending upwardly from the supports 52A and 52B.

As shown in FIG. 7A, each substrate 56 has one or more dies 108 on its lower surface. The surface 62 has a recess 78 between two ledges 80. The dies 108 fit into the recess 78 when the surface 62 moves up. The ledges 80 make contact with the substrate 56 next to the dies 108 and between the supports 52A and B.

The substrates 56A–C are then either heated or cooled. The substrates may be heated by applying a voltage so that current conducts through the resistive elements 69A. The resistive elements heat the thermal conditioning chuck 60, which in turn heats the substrates 56A–C. Alternatively, a cold fluid flowing through the passages 69B may cool the thermal conditioning chuck 60 and the substrates 56A–C. As such, the substrates 56A–C can be heated or cooled to any selected temperature between −55° and 150° C. Because the dies 108 (FIG. 7A) are in the recess 78, the material around the recess 78 assists in maintaining the temperature of the dies 108 at a desired level, especially near edges of the substrate 56.

It takes approximately one minute to heat or cool the substrates 56A–C, whereafter the air flow is turned off. The thermal conditioning chuck 60 is then moved in a direction opposite to the direction 70 so that the substrates 56A–C drop onto the supports 52A and 52B. The thermal conditioning chuck 60 is moved further down so that the surfaces 62 are located below the gaps 54.

Figure 8:
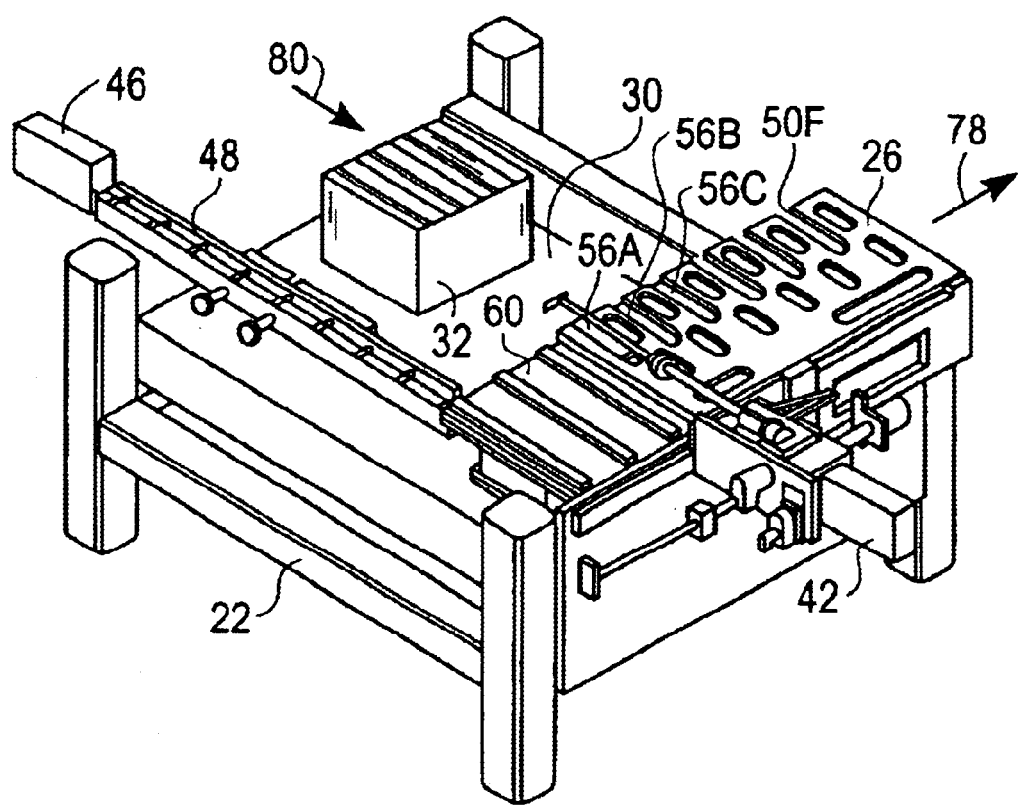
FIG. 8 is a perspective view similar to the perspective view of FIG. 2 after the transfer chuck is moved off the thermal conditioning chuck and the substrates are aligned with a test chuck.

As shown in FIG. 8, the transfer chuck 56 is moved in a direction 78 so that the substrates 56A–C are moved off the thermal conditioning chuck 60. The test chuck is movable on the platen 30 in horizontal x and y-directions and in a vertical z-direction. The test chuck 32 is first aligned with the substrates 56A–C and then moved in a direction 30 and underneath the transfer chuck 26. The test chuck 32 typically includes a forcer which rides on the platen 30, and is known in the art.

Figure 9:
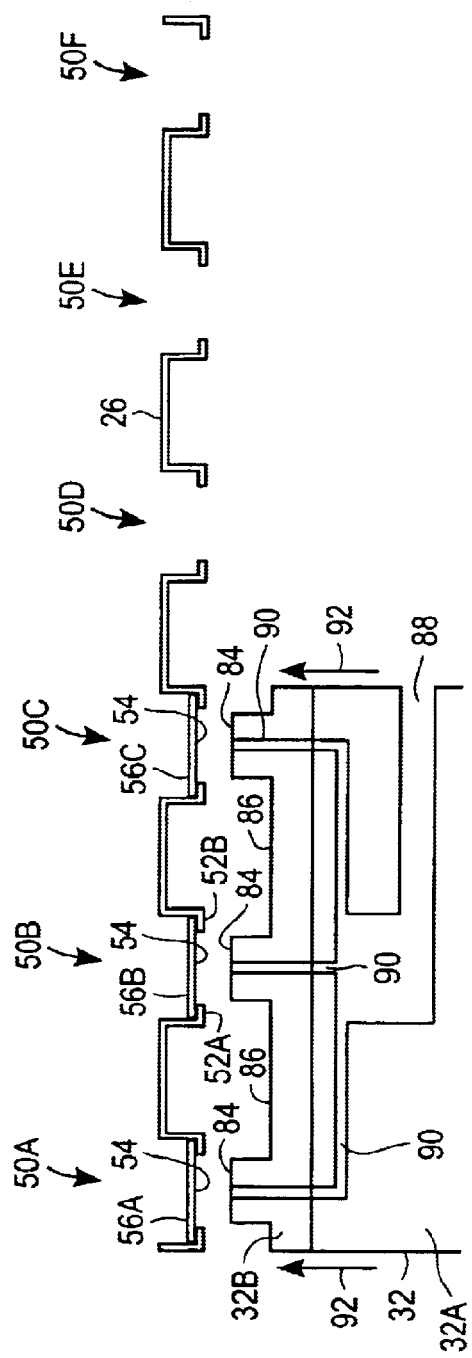
FIG. 9 is an end view illustrating the transfer chuck and the test chuck.

FIG. 9 illustrates the test chuck 32 located below the transfer chuck 26. The test chuck 32 has an upper side having three higher surfaces 84 with two lower surfaces 86 between them. Each higher surface 84 is located directly below a respective one of the gaps 54. An air outlet opening 88 is formed out of the test chuck 32. Air outlet passages 90 are formed into the surfaces 84 and are connected to the air outlet opening 88.

Figure 10:
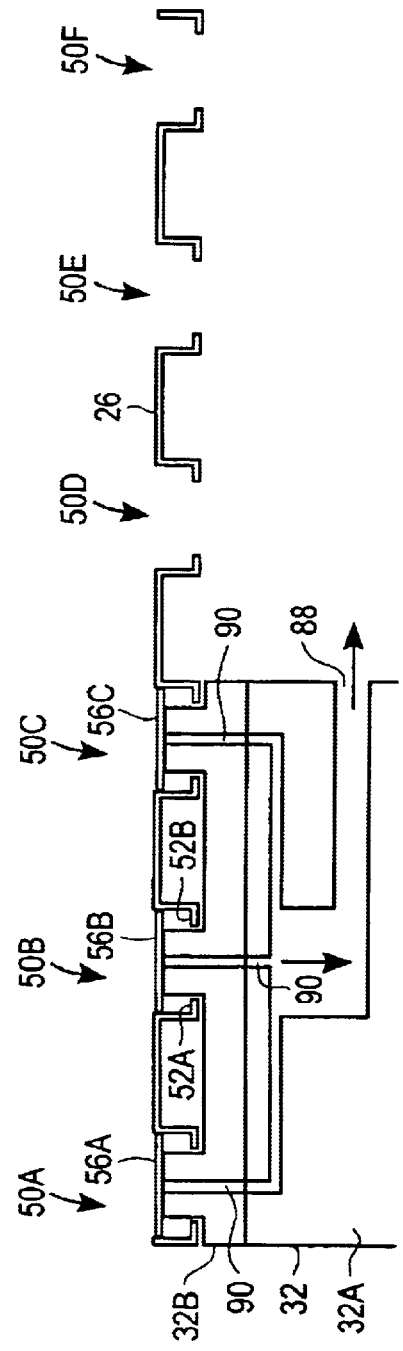
FIG. 10 is a view similar to FIG. 9 after the test chuck is elevated so as to elevate the substrates, and a vacuum is applied to secure the substrates to the test chuck.

The test chuck 32 is movable in a vertically upward z-direction 92. As shown in FIG. 10, such movement of the test chuck 32 moves the surfaces 84 through the gaps 54 so that the surfaces 84 contact the lower surfaces of the substrates 56A–C. Further movement of the test chuck 32 in the z-direction 92 elevates the substrates 56A–C off the supports 52A and 52B.

A vacuum is then created within the air outlet opening 88 which creates a vacuum in each one of the air outlet openings 90. The vacuums created in the air outlet openings 90 suck the substrates 56A–C down onto the surfaces 84. The substrates 56A–C are so secured to the test chuck 32.

The test chuck 32 includes a lower portion 32A and an upper portion 32B. The lower portion 32A is movable relative to the support frame. The upper portion 32B is disengageably secured to the lower portion 32A, and is thus "carried" by the lower portion. The upper portion 32B has the raised and recessed formations 84 and 86. The upper portion 32B is disengageable from the lower portion 32A to allow for interchangeability with another upper portion 32B with raised and recess formations sized for accommodating other substrates having larger or smaller widths than the substrates 56A–C. The gaps 54 are also adjustable to match widths on raised formations on a selected upper portion 32B.

Figure 11:
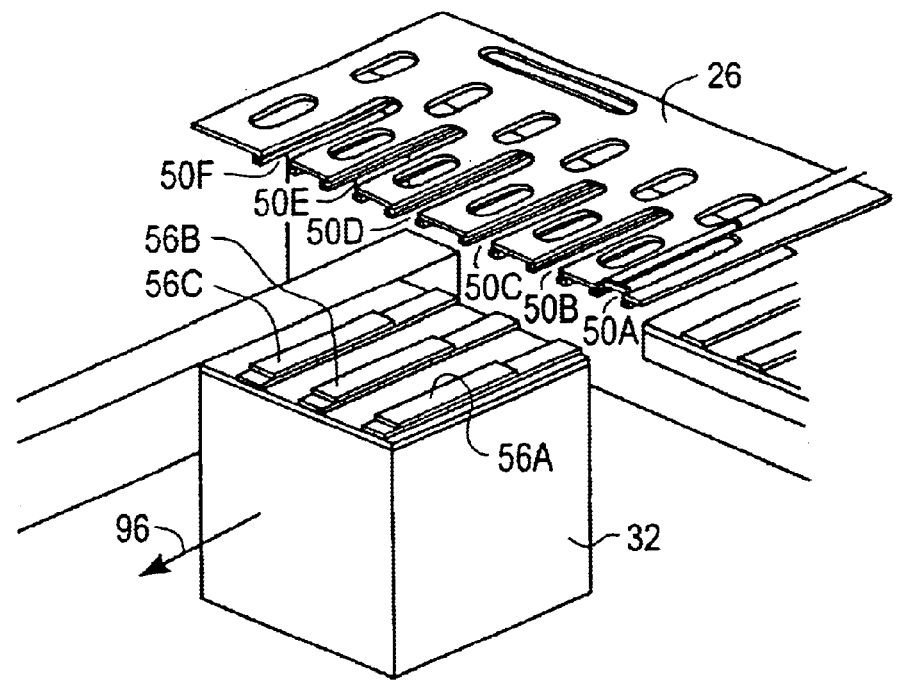
FIG. 11 is a perspective view illustrating how the test chuck removes the substrates from the transfer chuck.

As shown in FIG. 11, the test chuck 32 is then moved in a horizontal y-direction 96. Such movement moves the substrates 56A–C out of the slots 50A–C.

Figure 12:
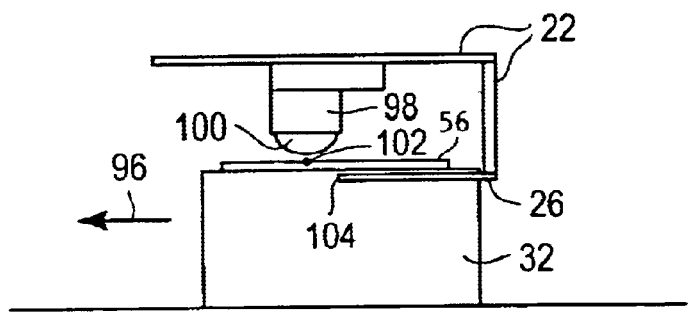
FIG. 12 is a side view illustrating components of the apparatus used to capture a two-dimensional image of an upper surface of each substrate.

As shown in FIG. 12, the apparatus also includes an image recordation device in the form of a line scanner 98 which is mounted in a stationary position to the support frame 22. The line scanner 98 has a lens 100. The lens 100 focuses on a line represented by a point 102 in FIG. 12 and extending into the paper. The line represented by the point 102 is located approximately 2 cm to the left of a location 104 where the substrates 56 leave the transfer chuck 26, as measured in the direction 96. One of the substrates 56 is approximately 20 cm long as measured in the direction 96. An entire lower surface of the substrates 56 is located on a respective upper surface of the test chuck 32.

Because of the relative lengths and distances, and in particular because the substrate 56 is longer than the distance between the locations 102 and 104, the lens 100 begins to focus on an upper surface of the substrates 56 while it is still located over the transfer chuck 26 and as it moves off the transfer chuck 26. The lens 100 simultaneously focuses on a line across upper surfaces of the substrates 56A–C in a similar manner. A one-dimensional image of the upper surface of each substrate 100 is taken along the line represented by the location 102, and provided by the line scanner 98 to an image capture device such as memory of a digital camera. Movement of the substrates 56 in the direction 96 moves the line represented by the location 102 across upper surfaces of the substrates 56 so that two-dimensional areas of the upper surfaces of the substrates 56 are scanned. A computer knows the speed at which the test chuck 32 moves in a direction 96 so that a two-dimensional image of the upper surfaces of each of the substrates 56 is rendered by logic of the computer.

The test chuck 32 is then further moved in the direction 96 until one of the substrates 56 is located below the contacts 38. It should be noted that the substrates 56 are moved in unison and pass by lens 100 only once. The test chuck 32 is thus not, for example, moved back and forth in the direction 96 and in a direction opposing the direction 96 past the lens 100. Because of a single pass past the lens 100, a very rough, although sufficient single image of upper surfaces of the substrates 56 is created but no time is lost by again scanning upper surfaces of the substrates 56. The image is still accurate to approximately 12 microns, which is at least an order of magnitude more accurate than what conventional handlers used for positioning of components or motherboards and other purposes are designed to be capable of. (Multiple passes may be required for other applications. For example, contacts on a wafer may be too small to accurately scan in a single pass. Multiple scans may be carried out, with each subsequent scan being used to more accurately locate the contacts on the wafer.)

The test chuck 32 can then be moved in x-, y-, and z-directions so that each one of the contacts 38 is brought into contact with a respective set of terminals on one of the substrates 56, followed by x-, y-, and z-movement of the test chuck 32 so that each one of the contacts 38 contacts a respective terminal on the other substrate, followed then by the third substrate. The contacts 38 are all electronically connected to the tester 40 so that test signals can be provided between the tester 40 and the terminals.

FIGS. 14 and 15 illustrate one of the substrates, for example the substrate 56A, in more detail. The substrate 56A includes a flexible sheet 104, a plurality of rigid substrates 106, and a plurality of electronic dies 108. The rigid substrates 106 are mounted to the flexible sheet 104. A plurality of the dies 108 are mounted on and protrude from a rear surface of a respective one of the rigid substrates 106. An electronic circuit is formed on a frontal surface of each one of the dies 108. A plurality of terminals 110 are located on each die 108 and are connected to the circuit formed in the respective die 108.

Figure 13:
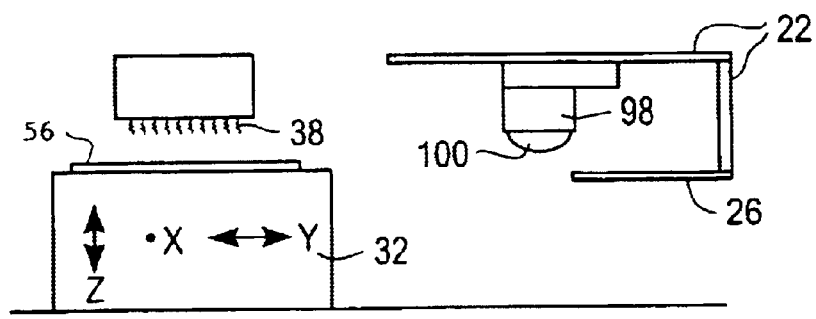
FIG. 13 is a view similar to FIG. 12 illustrating the location of the test chuck after the images are captured and the substrates are aligned with contacts.

The contacts 38 shown in FIG. 13 make contact with the terminals 110. Electronic signals are transmitted between the electric tester 40 shown in FIG. 1 through the contacts 38 and the terminals 110 to and from the circuit formed in the die 108. By relaying signals back and forth, the circuit within the die 108 can be tested with the electric tester 40. Once the circuit is tested, the test chuck 32 is moved vertically downward so as to disengage the terminal 110 from the contacts 36. The test chuck 2 is then moved in x- and y-directions to align terminals of another one of the dies 108 with the contacts 36, whereafter the test chuck 32 is moved vertically upward so as to engage the terminals of the other die 108 with the contacts 38. It may also be possible to test more of the dies 108 at once.

Once the circuits in all the dies 108 are tested, the test chuck 32 is moved in an x-direction so that each one of the substrates 56A–C is aligned with a respective one of the slots 50D–F. As shown in FIG. 16, the test chuck 32 is then moved in a direction 108 so that the substrates 56A–C are located in the slots 50D–F respectively. The vacuum on the test chuck is then released so that the substrates 56A–C are released from the test chuck 32. The test chuck 32 is then dropped so that the substrates 56A–C drop into supports of the slots 50D–F.

Figure 17:
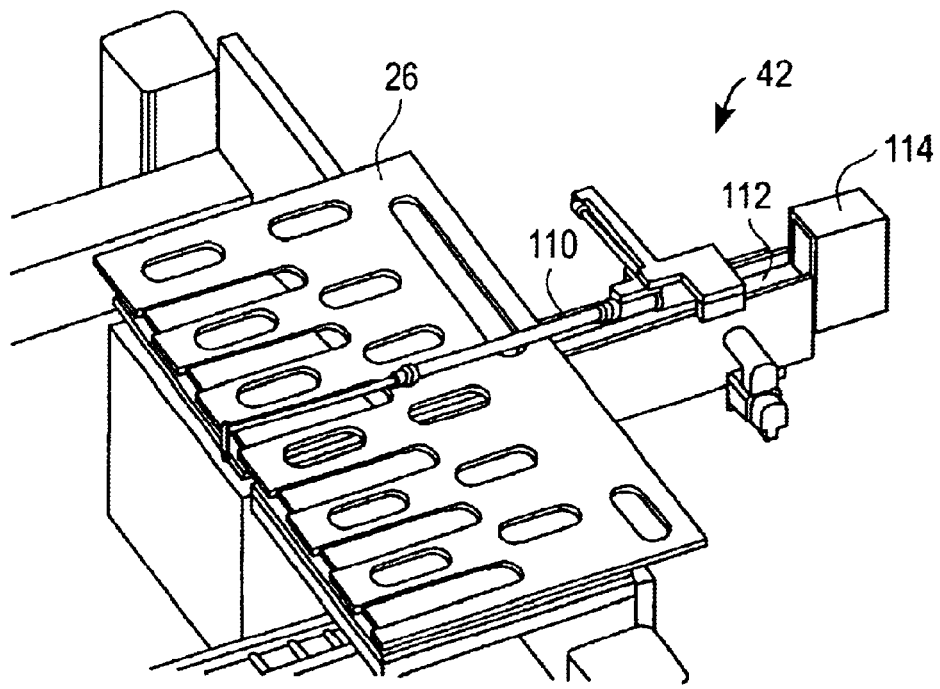
FIG. 17 is a perspective view illustrating the substrates after they are located in the transfer chuck but before they are removed therefrom utilizing substrate removal apparatus.
Figure 18:
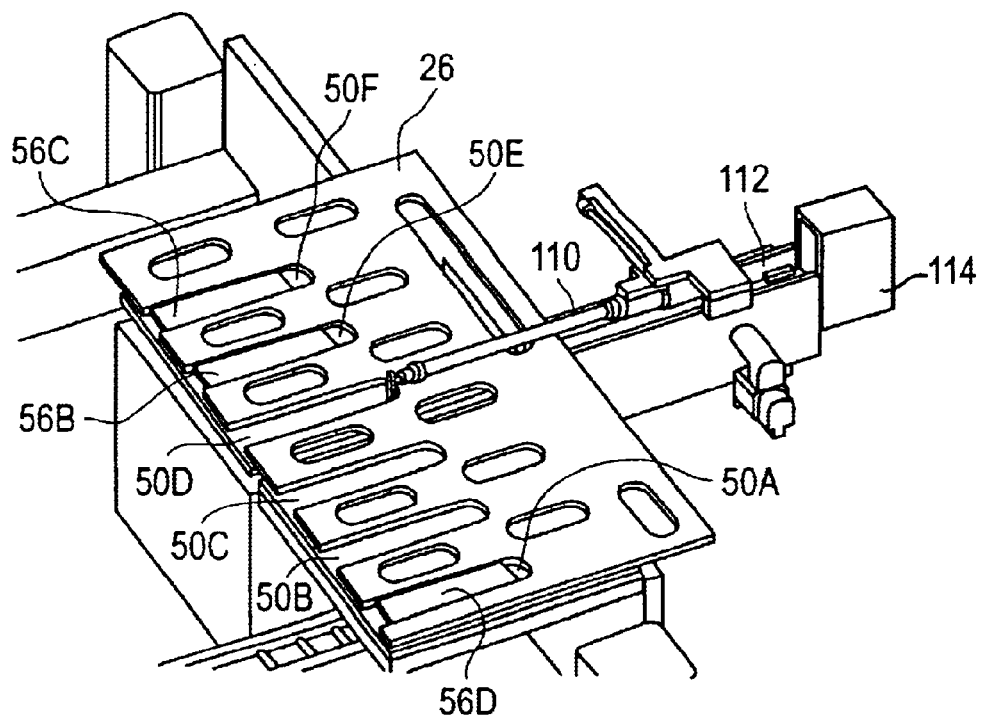
FIG. 18 is a view similar to FIG. 17 after one of the substrates is removed from the transfer chuck and a further substrate is located on the transfer chuck.

As shown in FIGS. 17 and 18, the substrate removal apparatus 42 includes a retracting tool 110, a conveyor system 112, and a removal cassette 114. The retracting tool 110 is first used to move the substrate 56A onto the conveyor system 112. The conveyor system then moves the substrate 56A into the removal cassette 114. While the substrate 56A is moved into the removal cassette 114, another substrate 56D is moved into the slot 50A.

The transfer chuck 26 is then moved in a direction illustrated by the direction 58 in FIG. 5 so that the substrates 56B and 56C are removed while additional substrates are located in the slots 50B and 50C.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of testing circuits on substrates, comprising:
   locating the substrates in a transfer apparatus;
   moving a surface of a test chuck into contact with the substrates held by the transfer apparatus;
   securing the substrates to the test chuck;
   moving substantially simultaneously the substrates off the transfer apparatus;
   recording an image of a surface of each of the substrates;
   moving terminals on the substrates into contact with contacts to electrically connect the circuit through terminals and the contacts to a tester, no more than a single image of the surface having been recorded;
   relaying signals through the terminals and the contacts between the electric tester and the circuits;
   disengaging the terminals from the contacts; and
   removing the substrates from the test chuck.

2. The method of claim 1 wherein the transfer apparatus is a transfer chuck and the image is recorded before having moved the substrates off the transfer chuck.

3. The method of claim 2 wherein the image is recorded while moving the substrates off the transfer chuck.

4. The method of claim 1 wherein the transfer apparatus is a transfer chuck and a plurality of separate substrates are located in the transfer chuck, a respective surface of the test chuck is moved into contact with each substrate, each substrate is secured to the test chuck, the substrates move simultaneously off the transfer chuck, and the substrates move simultaneously past the image recordation device so that an image of a surface of each substrate is recorded, each substrate having been moved once only past the image recordation device before the contacts contact terminals on the respective substrate.

5. The method of claim 4 wherein the images are recorded before having moved the substrates off the transfer chuck.

6. The method of claim 5 wherein the images are recorded while moving the substrates off the transfer chuck.

7. The method of claim 4 wherein the image recordation device is a line scanner having a lens which focuses on the surfaces of the substrates.

8. The method of claim 1, further comprising:

moving the test chuck so that the substrates move past an image recordation device to record the image of the surface of each substrate once only before moving the terminals into contact with the contacts.

9. A method of testing a circuit on a plurality of separate substrates, comprising:

locating the substrates in respective slots in a transfer chuck;

moving a plurality of respective surfaces of a test chuck into contact with each respective substrate held by the transfer chuck;

securing the substrates to the test chuck;

moving the test chuck relative to the transfer chuck so that the substrates move off the transfer chuck;

moving the test chuck so that the substrates move past an image recordation device having at least one lens focusing on a line across a width, transverse to a direction in which the substrates move, of each substrate, to record an image of a surface of each substrate;

moving terminals on the substrates into contact with contacts to electrically connect a circuit on each substrate through the terminals and the contacts to an electric tester, each substrate having been moved once only past the image recordation device to record the image of the surface of the respective substrate;

relaying signals through the terminals and the contacts between the electric tester and the respective circuits;

disengaging the terminals from the contacts; and removing the substrates from the test chuck.

* * * * *